US012322444B2

(12) United States Patent
Vahidimowlavi et al.

(10) Patent No.: US 12,322,444 B2
(45) Date of Patent: Jun. 3, 2025

(54) MEMORY DEVICES WITH CONTROLLED WORDLINE RAMP RATES, AND ASSOCIATED SYSTEMS AND METHODS

(71) Applicant: Micron Technology, Inc., Boise, ID (US)

(72) Inventors: Allahyar Vahidimowlavi, San Jose, CA (US); Kalyan C. Kavalipurapu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 17/238,482

(22) Filed: Apr. 23, 2021

(65) Prior Publication Data
US 2021/0241832 A1   Aug. 5, 2021

Related U.S. Application Data

(63) Continuation of application No. 16/752,981, filed on Jan. 27, 2020, now Pat. No. 11,004,513, which is a
(Continued)

(51) Int. Cl.
*G11C 16/12* (2006.01)
*G11C 5/06* (2006.01)
(Continued)

(52) U.S. Cl.
CPC .............. *G11C 16/08* (2013.01); *G11C 5/063* (2013.01); *G11C 8/08* (2013.01); *G11C 8/14* (2013.01);
(Continued)

(58) Field of Classification Search
CPC ........... G11C 16/08; G11C 5/063; G11C 8/08; G11C 8/14; G11C 16/0416; G11C 16/12
See application file for complete search history.

(56) References Cited

U.S. PATENT DOCUMENTS 5,777,926 A   7/1998 Trinh et al.
5,812,457 A * 9/1998 Arase .................. G11C 16/3459
                                                    365/185.17
(Continued)

FOREIGN PATENT DOCUMENTS

CN    101194323 A    6/2008
CN    102906820 A    1/2013
CN    106030719 A    10/2016

OTHER PUBLICATIONS

CN Patent Application No. 201910955883.4—Chinese Office Action and Search Report, dated Feb. 15, 2023, with English Translation, 11 pages.

*Primary Examiner* — Khamdan N. Alrobaie
(74) *Attorney, Agent, or Firm* — Perkins Coie LLP

(57) ABSTRACT

Memory devices with controlled wordline ramp rates and associated systems and methods are disclosed herein. In one embodiment, a memory device includes at least one voltage regulator and a plurality of wordlines. The memory device is configured, during a programming operation of the memory region, to ramp a selected wordline to a desired programming voltage while ramping one or more adjacent, unselected wordlines electrically coupled to the selected wordline to desired inhibit voltage(s) using the at least one voltage regulator. In some embodiments, the memory device ramps the selected wordline and the one or more adjacent, unselected wordlines such that the one or more adjacent, unselected wordlines reach the desired inhibit voltage(s) upon the selected wordline reaching the desired programming voltage. In these and other embodiments, the memory device ramps the selected wordline to the desired programming voltage without floating the selected wordline.

19 Claims, 7 Drawing Sheets

Related U.S. Application Data continuation of application No. 16/214,007, filed on Dec. 7, 2018, now Pat. No. 10,546,641.

(51) Int. Cl.
  *G11C 8/08* (2006.01)
  *G11C 8/14* (2006.01)
  *G11C 16/04* (2006.01)
  *G11C 16/08* (2006.01)

(52) U.S. Cl.
  CPC .......... *G11C 16/0416* (2013.01); *G11C 16/12* (2013.01)

(56) References Cited

U.S. PATENT DOCUMENTS

| | | | |
|---|---|---|---|
| 7,286,408 B1 * | 10/2007 | Higashitani | G11C 16/3418 365/185.18 |
| 7,307,878 B1 | 12/2007 | Lee et al. | |
| 7,656,710 B1 | 2/2010 | Wong | |
| 9,640,273 B1 * | 5/2017 | Chen | G11C 16/24 |
| 9,842,657 B1 | 12/2017 | Dutta et al. | |
| 9,887,002 B1 * | 2/2018 | Zhang | G11C 16/08 |
| 10,210,941 B1 * | 2/2019 | Chen | G11C 11/5642 |
| 10,438,671 B1 * | 10/2019 | Chen | G11C 16/08 |
| 10,546,641 B1 * | 1/2020 | Vahidimowlavi | G11C 8/14 |
| 2003/0165075 A1 | 9/2003 | Pio et al. | |
| 2006/0279990 A1 | 12/2006 | Wan et al. | |
| 2006/0291322 A1 | 12/2006 | Crippa et al. | |
| 2007/0236991 A1 | 10/2007 | Lee et al. | |
| 2011/0122693 A1 | 5/2011 | Tran et al. | |
| 2011/0157995 A1 * | 6/2011 | Bicksler | G11C 16/10 365/185.19 |
| 2011/0286265 A1 * | 11/2011 | Mokhlesi | G11C 16/10 365/185.02 |
| 2012/0218837 A1 | 8/2012 | Dimartino et al. | |
| 2012/0300550 A1 * | 11/2012 | Hemink | G11C 16/10 365/185.17 |
| 2013/0070532 A1 * | 3/2013 | Nawata | G11C 16/0483 365/185.18 |
| 2013/0182505 A1 * | 7/2013 | Liu | G11C 16/10 365/185.17 |
| 2014/0029345 A1 * | 1/2014 | Goda | G11C 16/10 365/185.18 |
| 2014/0198570 A1 * | 7/2014 | Hsieh | G11C 16/3459 365/185.03 |
| 2015/0279476 A1 | 10/2015 | Rajwade et al. | |
| 2016/0099047 A1 | 4/2016 | Lee | |
| 2016/0148691 A1 * | 5/2016 | Rabkin | G11C 16/0483 365/185.19 |
| 2016/0172056 A1 | 6/2016 | Huh | |
| 2020/0185033 A1 | 6/2020 | Vahidimowlavi et al. | |

* cited by examiner

MEMORY DEVICES WITH CONTROLLED WORDLINE RAMP RATES, AND ASSOCIATED SYSTEMS AND METHODS

CROSS-REFERENCE TO RELATED APPLICATIONS

This application is a continuation of U.S. patent application Ser. No. 16/752,981, filed Jan. 27, 2020; which is a continuation of U.S. patent application Ser. No. 16/214,007, filed Dec. 7, 2018, now U.S. Pat. No. 10,546,641; each of which is incorporated herein by reference in its entirety.

TECHNICAL FIELD

The present disclosure generally relates to memory devices. In particular, the present technology relates to memory devices with controlled wordline ramp rates, and associated systems and methods.

BACKGROUND

Memory devices are widely used to store information related to various electronic devices such as computers, wireless communication devices, cameras, digital displays, and the like. Information is stored by programming different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
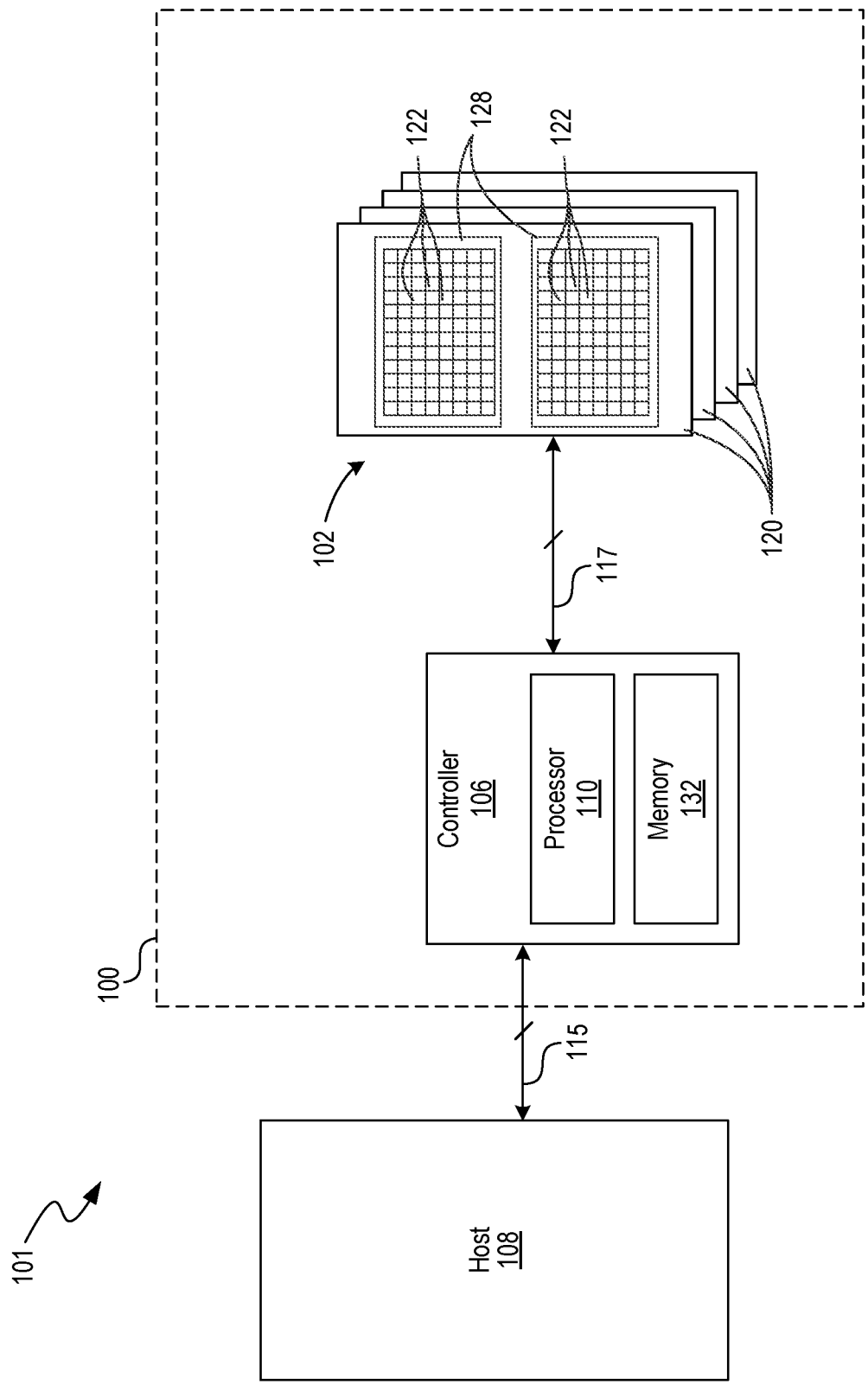
FIG. 1 is a block diagram of a system having a memory device configured in accordance with various embodiments of the present technology.

As discussed in greater detail below, the technology disclosed herein relates to memory devices that control voltage ramping of wordlines to reduce the typical time the memory devices require to program a page of memory cells (e.g., tPROG). In one embodiment, a memory device includes a memory region with a voltage regulator, a plurality of bitlines, a plurality of wordlines, and memory cells at intersections of the bitlines and the wordlines. During a programming operation, the memory device is configured to ramp a selected wordline in the plurality of wordlines to a desired programming voltage while ramping one or more adjacent, unselected wordlines that are electrically coupled to the selected wordline to one or more desired inhibit voltages. In some embodiments, the memory device ramps the selected wordline and/or the one or more adjacent, unselected wordline using their respective voltage regulators. In these and other embodiments, the memory device ramps the selected wordline and the one or more adjacent, unselected wordlines such that the one or more adjacent, unselected wordlines reach their desired inhibit voltages at approximately the same time that the selected wordline reaches the desired programming voltage. In these and still other embodiments, the memory device ramps the selected wordline and the one or more adjacent, unselected wordlines without floating the selected wordline (e.g., without turning off a driver of the selected wordline). As a result, memory devices configured in accordance with various embodiments of the present technology can be less sensitive to capacitance variations across the memory device and/or across program pulses, which can lead to a decrease in the number of program disturb events in these memory devices. In addition, typical page programming time (e.g., tPROG) of the memory device can be reduced in comparison with conventional wordline ramping methods, thereby increasing the programming speed of the memory device and/or lessening the amount of charge leakage experienced during programming operations.

Specific details of several embodiments of the present technology are described herein with reference to FIGS. 1-7. A person skilled in the art, however, will understand that the technology may be practiced without several of the details of the embodiments described below and that other embodiments in addition to those described herein are within the scope of the present technology. Further, embodiments of the present technology can have different configurations, components, and/or procedures than those shown or described herein. Moreover, although memory devices in the illustrated embodiments below are primarily described in the context of devices incorporating NAND-based storage media (e.g., NAND flash), memory devices configured in accordance with other embodiments of the present technology can include other types of memory devices (e.g., 3D-NAND, phase change memory, ferroelectric, volatile, etc.) and/or can include main memories that are not NAND-based (e.g., NOR-based) or only partially NAND-based.

FIG. 1 is a block diagram of a system 101 having a memory device 100 configured in accordance with various embodiments of the present technology. As shown, the memory device 100 includes a main memory 102 and a controller 106 operably coupling the main memory 102 to a host device 108 (e.g., an upstream central processor (CPU)).

The main memory 102 includes a plurality of memory regions, or memory units 120, which include a plurality of memory cells 122 at intersections of a plurality of bitlines (not shown) and a plurality of wordlines (not shown). Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. The main memory 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

The controller 106 can be a microcontroller, special purpose logic circuitry (e.g., a field programmable gate array (FPGA), an application specific integrated circuit (ASIC), etc.), or another suitable processor. The controller 106 can include a processor 110 configured to execute instructions stored in memory. In the illustrated example, the memory of the controller 106 includes an embedded memory 132 configured to store various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. In operation, the controller 106 can directly read, write, or otherwise program (e.g., erase) the various memory regions of the main memory 102, such as by reading from and/or writing to groups of memory cells 122 (e.g., memory pages and/or memory blocks 128) over a device bus 117.

The controller 106 communicates with the host device 108 over a system bus 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

Figure 2:
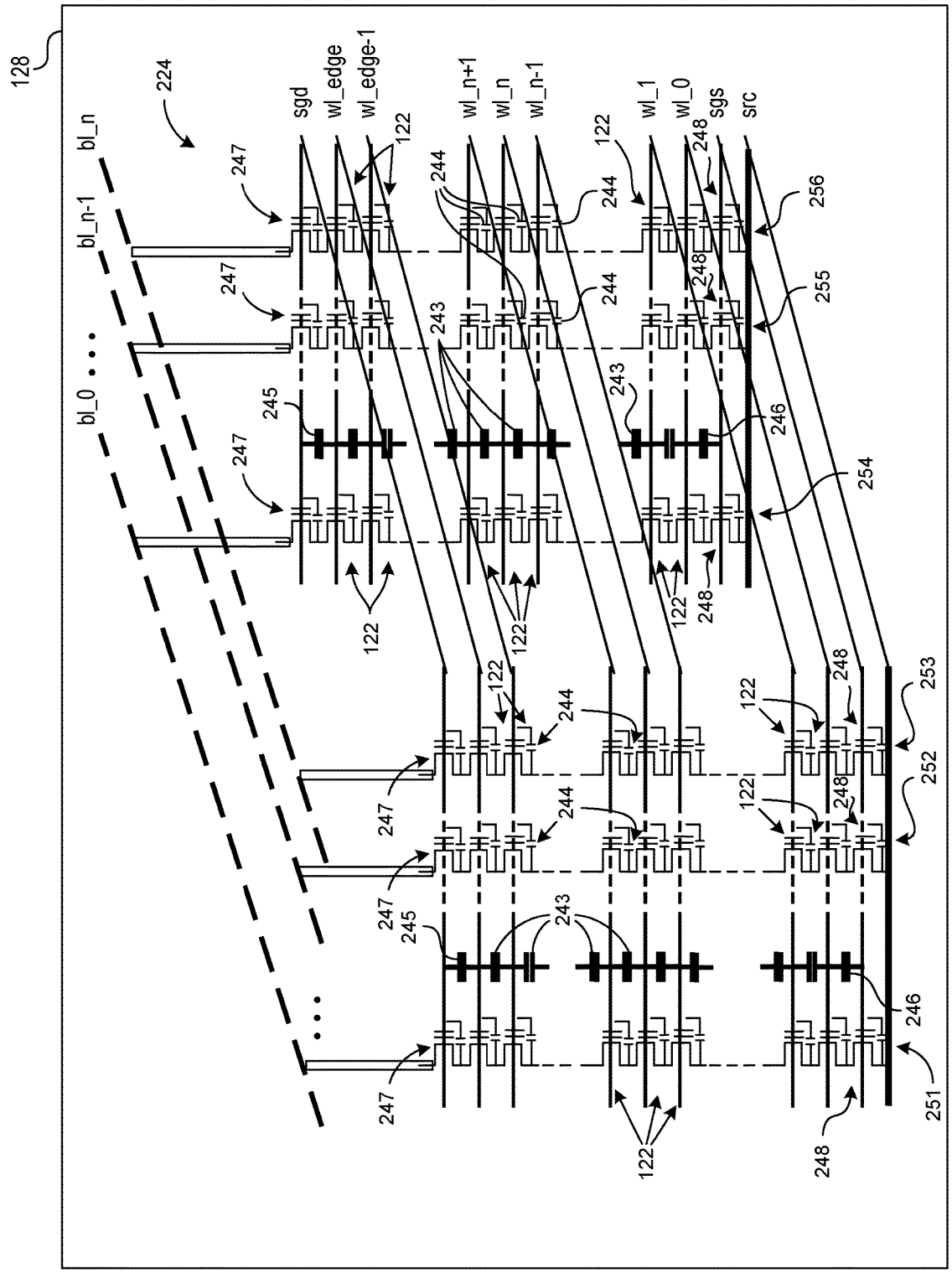
FIG. 2 is a schematic diagram of wordline and bitline couplings in a memory block of a memory device configured in accordance with various embodiments of the present technology.

FIG. 2 is a schematic diagram of wordline and bitline couplings in a memory block 128 of a memory device 100 configured in accordance with various embodiments of the present technology. As shown, a plurality of bitlines bl_0 through bl_n is connected to a plurality of wordlines wl_0 through wl_edge to form an array 224 of memory cells 122. The memory cells 122 of the array 224 are arranged in memory cell strings or pillars. For simplicity, only six memory cell strings 251-256 are illustrated in FIG. 2. Each of the memory cell strings 251-256 are connected to (i) a bitline selector sgd via a bitline select transistor 247 and (ii) a sourceline selector sgs via a sourceline transistor 248. The memory cell strings 251-256 are each connected to a common source line src. The bitline selector sgd is electrically coupled to an edge wordline wl_edge via one or more capacitors 245, and the sourceline selector sgs is electrically coupled to another edge wordline wl_0 via one or more capacitors 246.

Adjacent wordlines (e.g., wl_n, wl_n±1, wl_n±2, wl_n±3, etc.) in the plurality of wordlines wl_0 through wl_edge are coupled to one another via capacitors 243. In addition, each of the wordlines of the plurality of wordlines wl_0 through wl_edge is connected to a memory channel (not shown) of the memory device 100 via capacitors 244. As described in greater detail below, the capacitors 243 and 244 are used to ramp a selected wordline wl_n to a desired programming voltage Vpgm_fin and to ramp one or more adjacent, unselected wordlines wl_n− and/or wl_n+ to one or more desired inhibit voltages Vinhibit_n− and/or Vinhibit_n+, respectively, such that the memory device 100 can program memory cells 122 at intersections of the selected wordline wl_n and selected bitlines (not shown) during a program pulse tpulse of the memory device 100.

Figure 3:
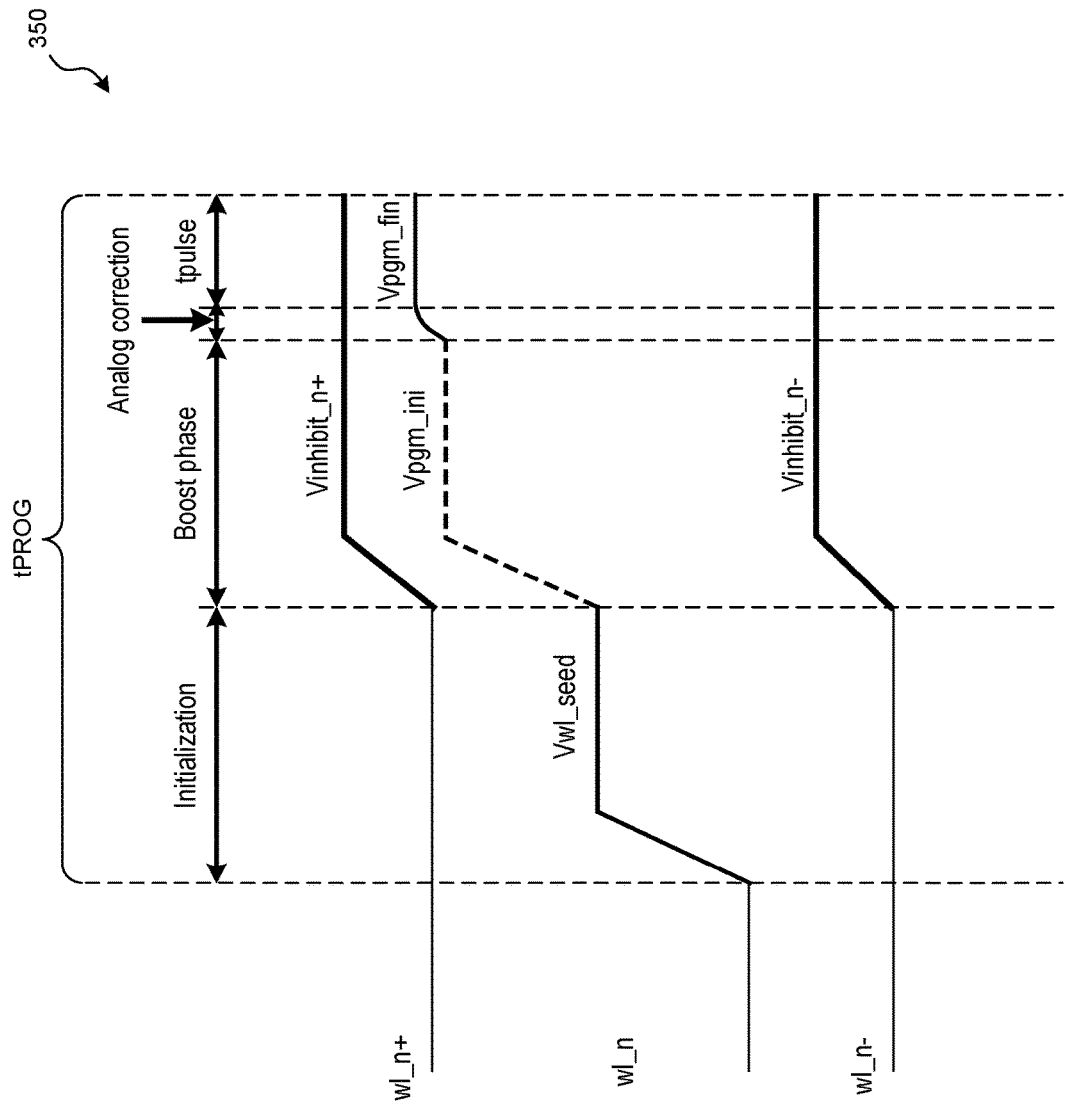
FIG. 3 is a line plot illustrating a conventional wordline boost ramping method leading up to a program pulse of a memory device.

FIG. 3 is a line plot of a conventional wordline boost ramping method. As shown, during an initialization phase of the conventional ramping method, a selected wordline wl_n is ramped to a seed voltage level Vwl_seed while adjacent, unselected wordlines wl_n− and wl_n+ are grounded. At the beginning of a boost phase, the driver of the selected wordline wl_n is turned off such that the selected wordline wl_n is floated while the adjacent, unselected wordlines wl_n− and wl_n+ are ramped to their respective inhibit voltages Vinhibit_n− and Vinhibit_n+. Charge is injected into the selected wordline wl_n during the boost phase to bring the selected wl_n to an initial programming voltage Vpgm_ini. In particular, charge is injected into the selected wordline wl_n via (i) capacitors 243 (FIG. 2) in the wordline-to-wordline couplings of the selected wordline wl_n to the adjacent, unselected wordlines wl_n− and (ii) capacitors 243 in the wordline-to-wordline couplings of the selected wordline wl_n to the adjacent, unselected wordlines wl_n+. In addition, charge is injected into the selected wordline wl_n via capacitors 244 (FIG. 2) in the wordline-to-channel coupling of the adjacent, unselected wordlines wl_n− and wl_n+ to the respective memory channel of the device. In other words, the voltage gain on the selected wordline wl_n is dependent upon the respective inhibit voltages Vinhibit_n− and/or Vinhibit_n+ of the adjacent, unselected wordlines wl_n− and/or wl_n+, the capacitance Cwl_wl of the capacitors 243 in the wordline-to-wordline coupling(s) of the selected wordline wl_n to adjacent, unselected wordline(s) wl_n− and/or wl_n+, and the capacitance Cwl_ch of the capacitors 244 in the wordline-to-channel coupling(s) of the adjacent, unselected wordline(s) wl_n− and/or wl_n+ to the respective memory channel (not shown). More specifically, the voltage gain on the selected wordline wl_n contributed by an adjacent, unselected wordline wl_n−1 via wordline-to-wordline coupling can be calculated using the following equation:

$$V_{gain\_wl\_n-1} = V_{inhibit\_n-1} * C_{wl\_wl}/(2*C_{wl\_wl}+C_{wl\_ch}).$$

Similarly, the voltage gain on the selected wordline wl_n contributed by an adjacent, unselected wordline wl_n+1 via wordline-to-wordline coupling can be calculated using the following equestion:

$$V_{gain\_wl\_n+1} = V_{inhibit\_n+1} * C_{wl\_wl}/(2*C_{wl\_wl}+C_{wl\_ch}).$$

Voltage gain contributions of other adjacent, unselected wordlines wl_n– and/or wl_n+ (e.g., wl_n+2, wl_n+3, etc.) can be calculated in a similar manner using appropriate versions of the above equations. Voltage gains from wordline-to-channel couplings can also be calculated using appropriate equations. In this manner, the selected wordline wl_n is ramped to the initial programming voltage Vpgm_ini (e.g., the seed voltage Vwl_seed plus the total voltage gain from the wordline-to-wordline and the wordline-to-channel couplings of the selected wordline wl_n to the adjacent, unselected wordlines wl_n– and wl_n+).

At the end of the boost phase, the initial programming voltage Vpgm_ini of the selected wordline wl_n is often not at a programming voltage Vpgm_fin that is desired to correctly program memory cells along the selected wordline wl_n. For example, as shown in FIG. 3, ramping of the selected wordline wl_n can undershoot the desired programming voltage Vpgm_fin (i.e., the initial programming voltage Vpgm_ini can be less than the desired programming voltage Vpgm_fin at the end of the boost phase). Alternatively, ramping of the selected wordline wl_n can overshoot the desired programming voltage Vpgm_fin (i.e., the initial programming voltage Vpgm_ini can be greater than Vpgm_fin at the end of the boost phase). Undershooting and overshooting can occur as a result of capacitance variations in the wordline-to-wordline and wordline-to-channel couplings across the main memory 102 (FIG. 1), across memory blocks 128 (FIGS. 1 and 2) in the main memory 102, across the array 224 (FIG. 2) of memory cells 122 (FIGS. 1 and 2) in a memory block 128, etc., and/or across programming pulses tpulse of the memory device 100 (e.g., due to data pattern changes that occur during programming of the memory cells 122). In addition, charge leakage from the capacitors 243 and 244 can contribute to undershooting the desired programming voltage Vpgm_fin. Thus, the conventional ramping method illustrated in FIG. 3 includes an analog correction phase during which the selected wordline wl_n can be brought to the desired programming voltage Vpgm_fin (e.g., by again turning on the driver of the selected wordline wl_n).

Occasionally, the analog correction phase of the conventional ramping method is not sufficient to bring (e.g., to drop) the initial programming voltage Vpgm_ini of the selected wordline wl_n to the desired programming voltage Vpgm_fin. As a result, one or more program disturbs can occur. In addition, as shown in FIG. 3, the typical page programming time tPROG under the conventional ramping method is equivalent to the sum of the initialization phase, the boost phase, the analog correction phase, and the programming pulse tpulse. As tPROG increases in duration, a greater amount of charge leakage can occur, which can lead to a higher occurrence of program disturbs. Thus, eliminating or lessening the duration of phases of the ramping procedure leading up to a programming pulse tpulse of the memory device 100 can lead to a shorter typical page programming time tPROG, less charge leakage, and/or a reduction in the occurrence of program disturbs.

Figure 4:
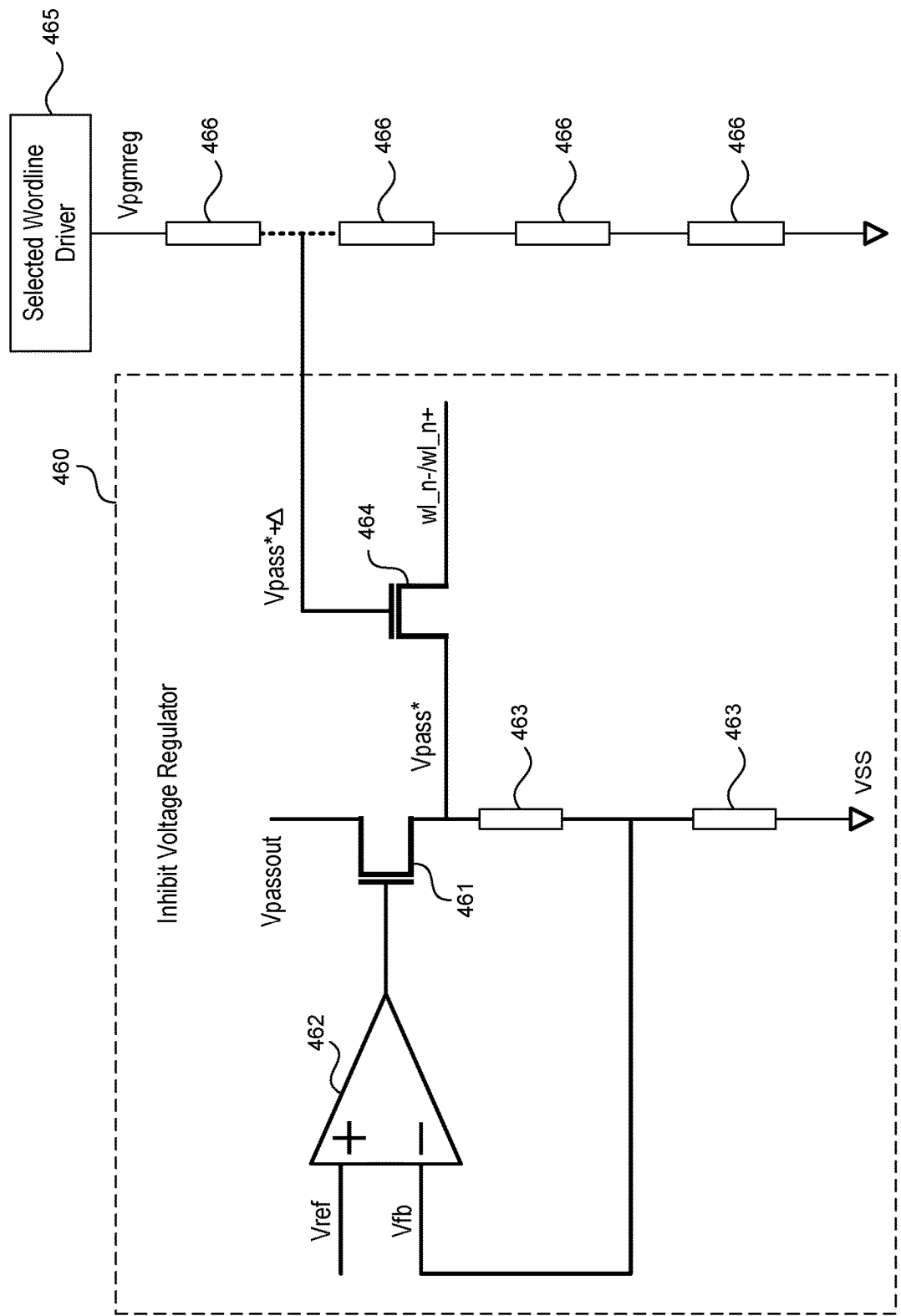
FIG. 4 is a schematic diagram of an inhibit voltage regulator configured in accordance with various embodiments of the present technology.

FIG. 4 is a schematic diagram of an inhibit voltage regulator 460 configured in accordance with various embodiments of the present technology. In some embodiments, a memory device 100 can include a single inhibit voltage regulator 460. In other embodiments, a memory device 100 can include multiple inhibit voltage regulators 460, such as an inhibit voltage regulator 460 per memory unit 120 (FIG. 1), per memory block 128 (FIGS. 1 and 2), per memory channel, per memory page, per wordline, per group of wordlines, etc. As shown in FIG. 4, an inhibit voltage regulator 460 can include a pass out transistor 461, a pass transistor 464, an operational amplifier 462, and one or more resistors 463. The inhibit voltage regulator 460 can be electrically coupled to a selected wordline driver 465 of a memory device 100 via the pass transistor 464 and a voltage divider that includes one or more resistors 466. In some embodiments, the one or more resistors 466 of the voltage divider and/or the one or more resistors 463 of the inhibit voltage regulator 460 can have the same or varying resistances. As described in greater detail below, the selected wordline driver 465 and the inhibit voltage regulator 460 can operate in tandem to ramp a selected wordline wl_n (FIG. 2) and one or more adjacent, unselected wordlines wl_n– and/or wl_n+ such that the selected and unselected wordlines reach flat top (e.g., a desired programming voltage Vpgm_fin and respective inhibit voltages Vinhibit_n– and/or Vinhibit_n+, respectively) at approximately the same time. In other words, as the selected wordline driver 465 ramps a selected wordline wl_n, the inhibit voltage regulator(s) 460 can force the one or more adjacent, unselected wordlines wl_n– and/or wl_n+ to ramp at the same time.

Figure 5:
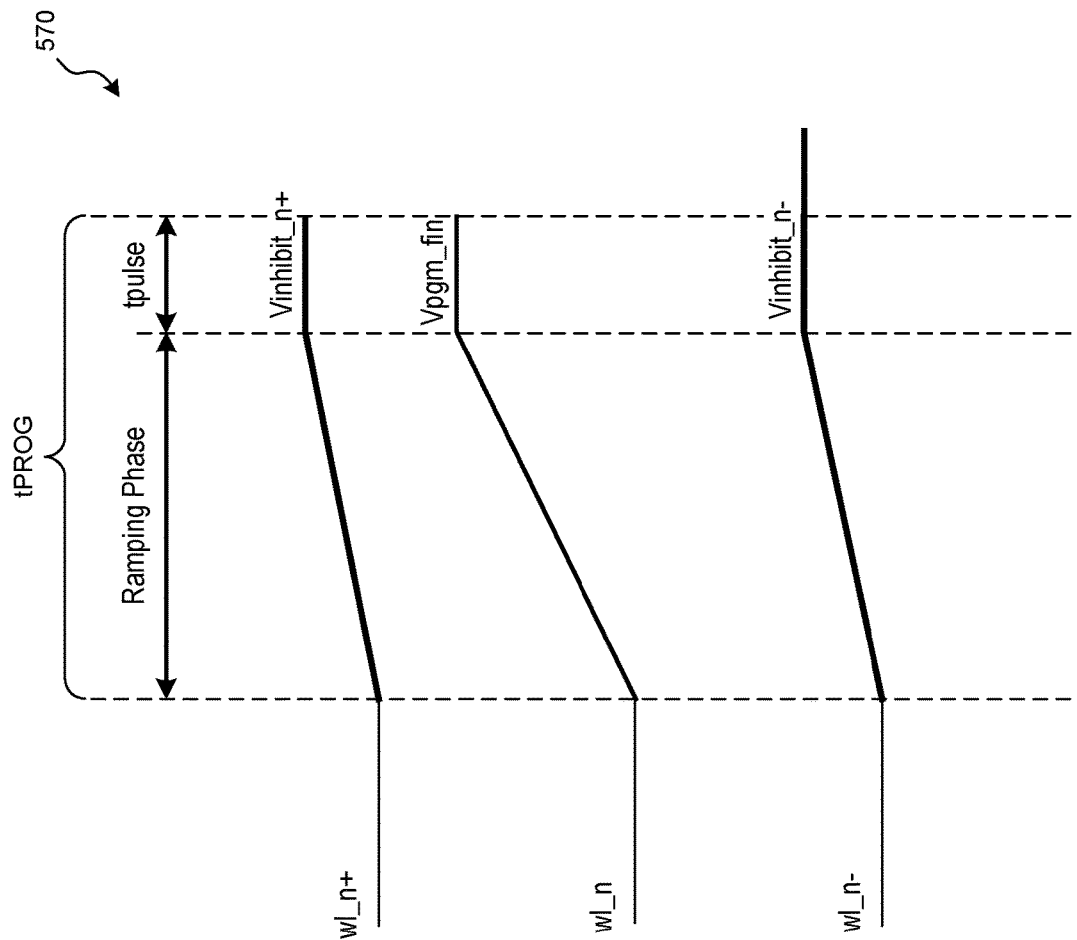
FIG. 5 is a line plot illustrating a wordline ramping method in accordance with various embodiments of the present technology.

FIG. 5 is a line plot 570 illustrating a wordline ramping method in accordance with various embodiments of the present technology. In comparison with the conventional ramping method illustrated in FIG. 3, the wordline ramping method illustrated in FIG. 5 includes only a ramping phase before a program pulse tpulse of a memory device 100. During the ramping phase, a selected wordline wl_n and one or more adjacent, unselected wordlines wl_n– and/or wl_n+ are continuously ramped (e.g., the selected wordline driver 465 of the selected wordline wl_n is never shut off) to their desired flat tops (e.g., using one or more voltage regulators). Also shown, the selected wordline wl_n reaches flat top (e.g., a desired programming voltage Vpgm_fin) at approximately the same time that the one or more adjacent, unselected wordlines wl_n– and/or wl_n+reach their flat tops (e.g., desired inhibit voltages Vinhibit_n– and/or Vinhibit_n+, respectively).

For the sake of clarity and understanding, consider the following example with reference to FIGS. 4 and 5 where the desired programming voltage Vpgm_fin is 24V and the desired inhibit voltages Vinhibit_n– and Vinhibit_n+ are 12V. During the ramping phase illustrated by the line plot 570 in FIG. 5, a selected wordline driver 465 (FIG. 4) of a selected wordline wl_n is activated to gradually ramp the selected wordline wl_n to 24V (e.g., using a respective voltage regulator). As a voltage Vpgmreg on the selected wordline driver 465 increases, a voltage applied to the pass transistor 464 (e.g., to a gate of the pass transistor 464 electrically coupled to the voltage divider connected to the selected wordline driver 465) of the inhibit voltage regulator 460 increases. At the same time, a voltage Vpassout is passed to the inhibit voltage regulator 460 from a charge pump (not shown) and a reference voltage Vref is input into the non-inverting terminal of the operational amplifier 462. The reference voltage Vref can be a voltage defined based at least in part on the gain of the resistors 463 in the inhibit voltage regulator 460 and/or on the desired inhibit voltages Vinhibit_n– and/or Vinhibit_n+. For example, if the gain of the resistors 463 in the voltage regulator 460 is 10, the reference voltage Vref can be defined as 1.2V (e.g., a tenth of the desired inhibit voltages Vinhibit_n– and Vinhibit_n+ of 12V). When the reference voltage Vref is greater than a feedback voltage Vfb received at an inverting terminal of the operational amplifier 462, the operational amplifier 462 can apply a voltage to the gate of the pass out transistor 461 that permits charge to pass through the pass out transistor 461 and create a voltage Vpass*. In the above example, when the gain of the resistors 463 in the voltage regulator 460 is 10, the reference voltage Vref of 1.2V will be greater than the feedback voltage Vfb until the voltage Vpass* reaches 12V.

When the voltage applied from the selected wordline driver 465 to the gate of the pass transistor 464 reaches a voltage Vpass*+4 (e.g., a voltage equal to the voltage Vpass* plus a threshold voltage A of the pass transistor 464), the pass transistor 464 can permit charge to pass through the pass transistor 464 from the inhibit regulator 460 to capacitor(s) 243 and 244 electrically coupled to one or more adjacent, unselected wordlines wl_n− and/or wl_n+ (e.g., the adjacent, unselected wordlines wl_n−1 and wl_n+1; FIG. 2). As a result, the one or more adjacent, unselected wordlines wl_n− and/or wl_n+can be ramped to their respective inhibit voltages Vinhibit_n− and/or Vinhibit_n+. At the end of the ramping phase illustrated in the line plot 570, the feedback voltage Vfb input into the inverting terminal of the operational amplifier 462 exceeds the reference voltage Vref. In the above example, this occurs when the voltage Vpass* reaches 12V. At this time, the operational amplifier 462 can apply a voltage to the gate of the pass out transistor 461 such that charge is prevented from passing through the pass out transistor 461 from the charge pump. As a result, the ramping of the one or more adjacent, unselected wordlines wl_n− and/or wl_n+terminates at the desired inhibit voltages Vinhibit_n− and/or Vinhibit_n+ (e.g., at 12V based on the above example).

In comparison with the conventional ramping method illustrated in FIG. 3, the adjacent, unselected wordlines wl_n− and/or wl_n+ramped in accordance with the wordline ramping method illustrated in FIG. 5 are not grounded while the selected wordline wl_n is ramped. In addition, the selected wordline wl_n is not floated while the one or more adjacent, unselected wordlines wl_n− and/or wl_n+ are ramped. Instead, the selected wordline wl_n is continuously ramped to the desired programming voltage Vpgm_fin across the ramping phase of the wordline ramping method illustrated in Figure at the same time that the one or more adjacent, unselected wordlines wl_n− and/or wl_n+ are continuously ramped across the ramping phase of the wordline ramping method to the desired inhibit voltage(s) Vinhibit_n− and/or Vinhibit_n+. As a result, the capacitance seen by the selected wordline driver 465 (FIG. 4) from the wordline-to-wordline and wordline-to-channel couplings is reduced by a factor of a desired inhibit voltage Vinhibit_n− and/or Vinhibit_n+ of adjacent, unselected wordline wl_n− and/or wl_n+, respectively, to the desired programming voltage Vpgm_fin (e.g., Vinhibit_n−/Vgm_fin and/or Vinhibit_n+/Vpgm_fin), which aids the selected wordline driver 465 in ramping the selected wordline wl_n to the desired programming voltage more quickly. In the case where the desired inhibit voltage Vinhibit_n+ is equal to the inhibit voltage V_inhibit_n−, the capacitance seen by the selected wordline driver 465 from the wordline-to-wordline and wordline-to-channel couplings is reduced by a factor of the desired inhibit voltage Vinhibit to the desired programming voltage Vpgm_fin, or Vinhibit/Vpgm_fin.

In addition, in contrast to the conventional method illustrated in FIG. 3, the ramping method illustrated in FIG. 5 does not rely on charge injected into the selected wordline wl_n from the wordline-to-wordline and wordline-to-channel couplings to ramp the selected wordline wl_n. As such, a memory device 100 employing the wordline ramping method illustrated in FIG. 5 is less sensitive to capacitance variations across the memory device 100 and/or across programming pulses tpulse. Furthermore, the continuous ramping of the selected wordline wl_n without floating the selected wordline wl_n reduces the possibility that a programming voltage Vpgm on the selected wordline wl_n overshoots or undershoots the desired programming voltage Vpgm_fin. Therefore, the occurrence of program disturb events can be reduced, and an analog correction phase is not required in the wordline ramping method illustrated in FIG. 5. As such, the duration of the ramping phase can be shorter than the duration of the initialization phase plus the boost phase and/or the analog phase in the conventional ramping method illustrated in FIG. 3. Thus, the typical page programming time tPROG of a memory device 100 configured in accordance with the present technology and employing the wordline ramping method illustrated in FIG. 5 can be reduced and/or the programming speeds of the memory device 100 can be increased. In turn, the period of time during which charge can leak from the capacitors 243 and/or 244 (FIG. 2) is reduced, leading to less charge leakage and/or a reduction in the occurrence of program disturb events.

Figure 6:
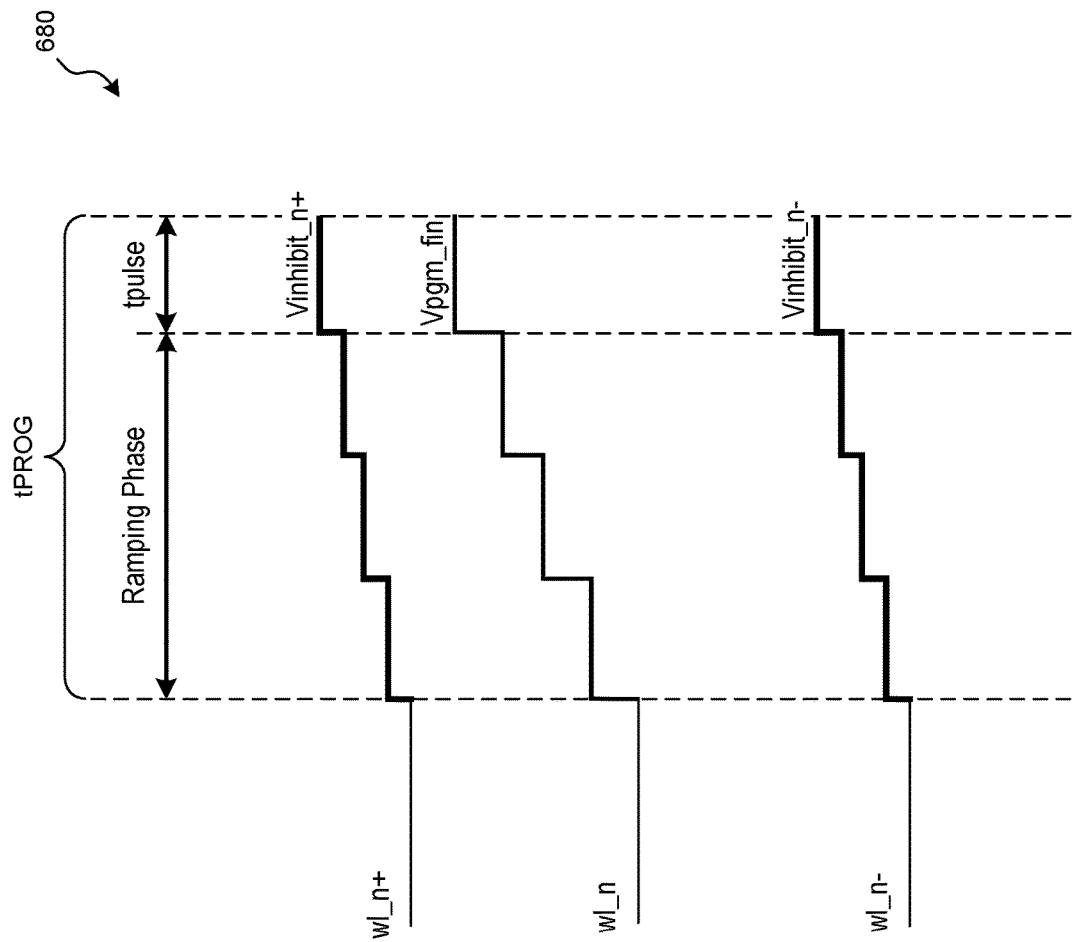
FIG. 6 is a line plot illustrating a wordline ramping method in accordance with various embodiments of the present technology.

FIG. 6 is a line plot 680 illustrating a wordline ramping method in accordance with various embodiments of the present technology. The wordline ramping method illustrated by the line plot 680 differs from the wordline ramping method illustrated by the line plot 570 in FIG. 5 in that a selected wordline wl_n and one or more adjacent, unselected wordlines wl_n− and/or wl_n+ are ramped to their flat tops in multiple steps. In some embodiments, this can be achieved by adjusting a reference voltage Vref input into the non-inverting terminal of the operational amplifier 462 (FIG. 4) of the inhibit voltage regulator 460 (FIG. 4). Returning to the previous example for the sake of understanding, if the gain of the resistors 463 (FIG. 4) in the inhibit voltage regulator 460 is 10, the reference voltage Vref can be increased in 120 mV increments to ramp the one or more adjacent, unselected wordlines wl_n− and/or wl_n+ to their respective inhibit voltages Vinhibit_n− and Vinhibit_n+ of 12V in ten steps. At the same time, by adjusting a reference voltage Vref input into a voltage regulator (not shown) of the selected wordline wl_n in a similar manner (e.g., in ten 240 mV steps, assuming the gain of the resistors (not shown) in the voltage regulator of the selected wordline wl_n is 10), the voltage on the selected wordline wl_n will increase in ten 2.4V steps until the selected wordline wl_n reaches the desired programming voltage Vpgm_fin of 24V. As such, the inhibit voltage regulator(s) 460 and the voltage regulator of the selected wordline wl_n of the present technology can provide digital control over the ramping of the selected wordline wl_n and the adjacent, unselected wordlines wl_n− and wl_n+.

Figure 7:
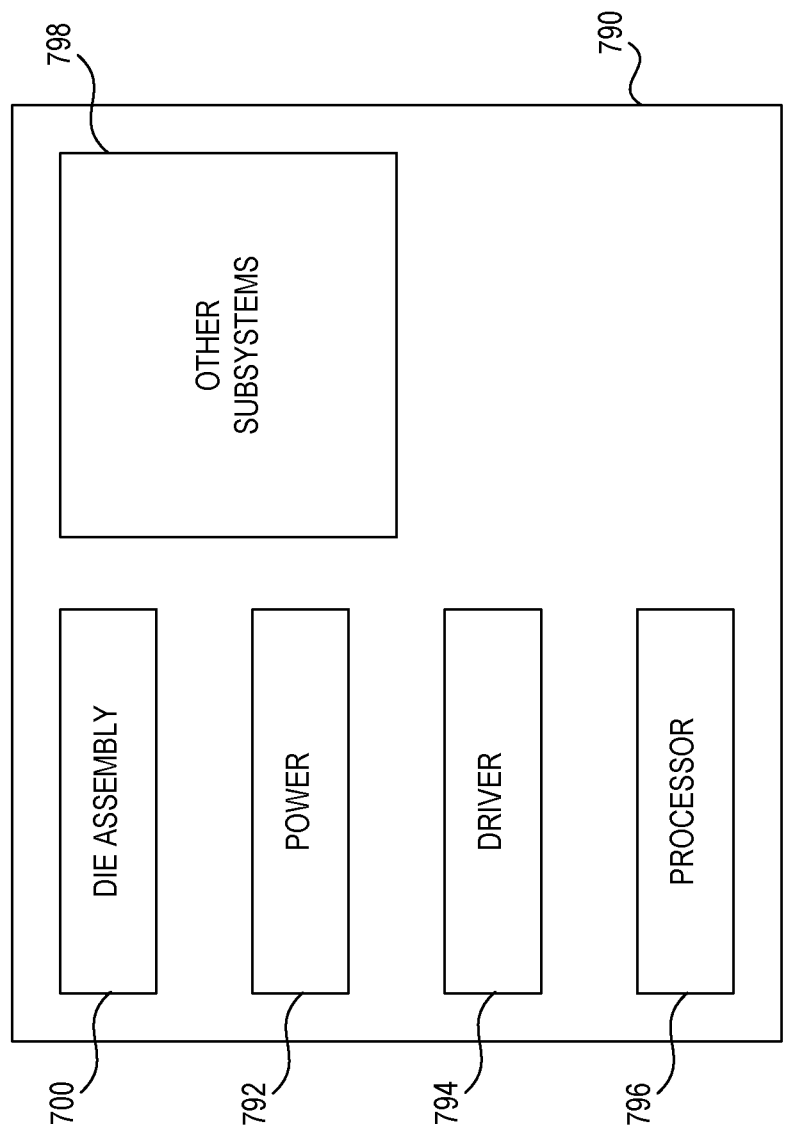
FIG. 7 is a schematic view of a system that includes a memory device configured in accordance with various embodiments of the present technology.

FIG. 7 is a schematic view of a system that includes a memory device in accordance with embodiments of the present technology. Any one of the foregoing memory devices described above with reference to FIGS. 1-6 can be incorporated into any of a myriad of larger and/or more complex systems, a representative example of which is system 790 shown schematically in FIG. 7. The system 790 can include a memory device assembly 700, a power source 792, a driver 794, a processor 796, and/or other subsystems and components 798. The memory device assembly 700 can include features generally similar to those of the memory devices described above with reference to FIGS. 1-6, and can, therefore, include various features of wordline ramp rate control during programming pulses of the memory device assembly 700. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, vehicles, appliances, and other products. Components of the system 790 may be housed in a single unit or distributed over multiple, interconnected units (e.g., through a communications network). The components of the system 790 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device configured to, for a single program pulse, (a) ramp a selected wordline to a desired programming voltage in more than two steps and (b) ramp an unselected wordline from ground to a desired inhibit voltage in more than two steps such that the unselected wordline reaches the desired inhibit voltage at a same time that the selected wordline reaches the desired programming voltage.

2. The semiconductor device of claim 1, wherein the semiconductor device is configured to ramp the selected wordline to the desired programming voltage without floating the selected wordline.

3. The semiconductor device of claim 1, wherein the unselected wordline is adjacent the selected wordline.

4. The semiconductor device of claim 1, comprising a voltage regulator electrically coupled to the selected wordline and to the unselected wordline.

5. The semiconductor device of claim 4, wherein the semiconductor device is configured to ramp the unselected wordline to the desired inhibit voltage using the voltage regulator.

6. The semiconductor device of claim 1, comprising a driver electrically coupled to the selected wordline and to the unselected wordline.

7. The semiconductor device of claim 6, wherein the semiconductor device is configured to ramp the unselected wordline to the desired inhibit voltage using the driver.

8. The semiconductor device of claim 6, wherein the semiconductor device is configured to ramp the selected wordline to the desired programming voltage using the driver.

9. The semiconductor device of claim 1, wherein the semiconductor device is configured to ramp the selected wordline from ground to the desired programming voltage in more than two steps.

10. The semiconductor device of claim 4, wherein the voltage regulator corresponds to the unselected wordline and is electrically coupled to the selected wordline via a driver corresponding to the selected wordline.

11. The semiconductor device of claim 1, wherein the semiconductor device is configured to ramp the unselected wordline to the desired inhibit voltage and ramp the selected wordline to the desired programming voltage in a same number of steps.

12. A semiconductor device configured to, for a single program pulse, (a) ramp a selected wordline to a desired programming voltage in more than two steps and (b) ramp an unselected wordline to a desired inhibit voltage in more than two steps such that the unselected wordline reaches the desired inhibit voltage at a same time that the selected wordline reaches the desired programming voltage.

13. The semiconductor device of claim 12, wherein the semiconductor device is configured to ramp the selected wordline from ground to the desired programming voltage in more than two steps.

14. The semiconductor device of claim 12, wherein the semiconductor device is configured to ramp the selected wordline to the desired programming voltage without floating the selected wordline.

15. The semiconductor device of claim 12, wherein the semiconductor device is configured to ramp the unselected wordline to the desired inhibit voltage and ramp the selected wordline to the desired programming voltage in a same number of steps.

16. A semiconductor device configured to, for a single program pulse, (a) ramp a selected wordline to a desired programming voltage in more than two steps and (b) ramp an unselected wordline to a desired inhibit voltage in more than two steps and such that the unselected wordline reaches the inhibit voltage at a same time that the selected wordline reaches the desired programming voltage, wherein the semiconductor device comprises:
- a driver electrically coupled to the selected wordline and configured to ramp the selected wordline to the desired programming voltage, and
- a voltage regulator electrically coupled to the unselected wordline and configured to ramp the unselected wordline to the desired inhibit voltage, wherein the voltage regulator is electrically coupled to the selected wordline via the driver.

17. The semiconductor device of claim 16, wherein the voltage regulator is electrically coupled to the driver such that ramping of the selected wordline using the driver enables ramping of the unselected wordline using the voltage regulator.

18. The semiconductor device of claim 16, wherein the semiconductor device is configured to ramp the selected wordline to the desired programming voltage without floating the selected wordline.

19. The semiconductor device of claim 16, wherein the semiconductor device is configured to ramp the unselected wordline to the desired inhibit voltage and ramp the selected wordline to the desired programming voltage in a same number of steps.

* * * * *